(12) United States Patent
Chen et al.

(10) Patent No.: US 12,635,101 B2
(45) Date of Patent: May 19, 2026

(54) MOUNTING STRUCTURE, CABINET, AND COMPUTING DEVICE

(71) Applicant: Fulian Precision Electronics (Tianjin) Co., LTD., Tianjin (CN)

(72) Inventors: Hung-Wei Chen, New Taipei (TW); Tzu-Yao Weng, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 105 days.

(21) Appl. No.: 18/667,115

(22) Filed: May 17, 2024

(65) Prior Publication Data

US 2025/0048579 A1      Feb. 6, 2025

(30) Foreign Application Priority Data

Aug. 3, 2023      (CN) ......................... 202310973432.X

(51) Int. Cl.
*H05K 7/14*               (2006.01)
(52) U.S. Cl.
CPC ......... *H05K 7/1424* (2013.01); *H05K 7/1402* (2013.01); *H05K 7/1461* (2013.01)
(58) Field of Classification Search
None
See application file for complete search history.

(56) References Cited

U.S. PATENT DOCUMENTS

| | | | |
|---|---|---|---|
| 9,426,908 B1 * | 8/2016 | Hsiao ................... | G11B 33/128 |
| 2006/0041783 A1 * | 2/2006 | Rabinovitz ............. | G06F 1/187 714/6.12 |
| 2009/0279249 A1 * | 11/2009 | Crippen ............... | G11B 33/124 361/679.58 |
| 2014/0345105 A1 * | 11/2014 | Brockett ................ | G06F 1/187 29/762 |
| 2015/0015131 A1 * | 1/2015 | Privitera ................ | G06F 1/187 312/309 |
| 2017/0188478 A1 * | 6/2017 | Wang ................... | G11B 33/124 |

* cited by examiner

*Primary Examiner* — James Wu
*Assistant Examiner* — Christopher L Augustin
(74) *Attorney, Agent, or Firm* — ScienBiziP, P.C.

(57)      ABSTRACT

A mounting structure for mounting a data storage device includes a cage, a sliding piece, a door, and a lock. The cage has an opening and a cavity. The sliding piece is slidable between a first position and a second position. The sliding piece has a pushing part. The door is rotatably located on the sliding piece and configured for covering or uncovering the opening. The lock is located on the cage and configured for locking the door to cover the opening. When the data storage device is accommodated in the cavity, the door is locked by the lock and the sliding piece is located on the first position, when the lock unlocks the door and the sliding piece slides to the second position, the pushing part pushes the data storage device outwards from the cavity through the opening. A cabinet and a computing device are also disclosed.

11 Claims, 10 Drawing Sheets

200 (300 )

MOUNTING STRUCTURE, CABINET, AND COMPUTING DEVICE

FIELD

The disclosure herein generally relates to information computing systems, and more particularly relates to a mounting structure, a cabinet, and a computing device.

BACKGROUND

When installing a data storage device, such as solid state drive (SSD), to a cabinet, usually a carrier is necessary for fixing the SSD, and users need to fix the SSD to the carrier and then fix the carrier to the cabinet by screws. However, it is inconvenient to installing the SSD to the cabinet or removing the SSD from the cabinet.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
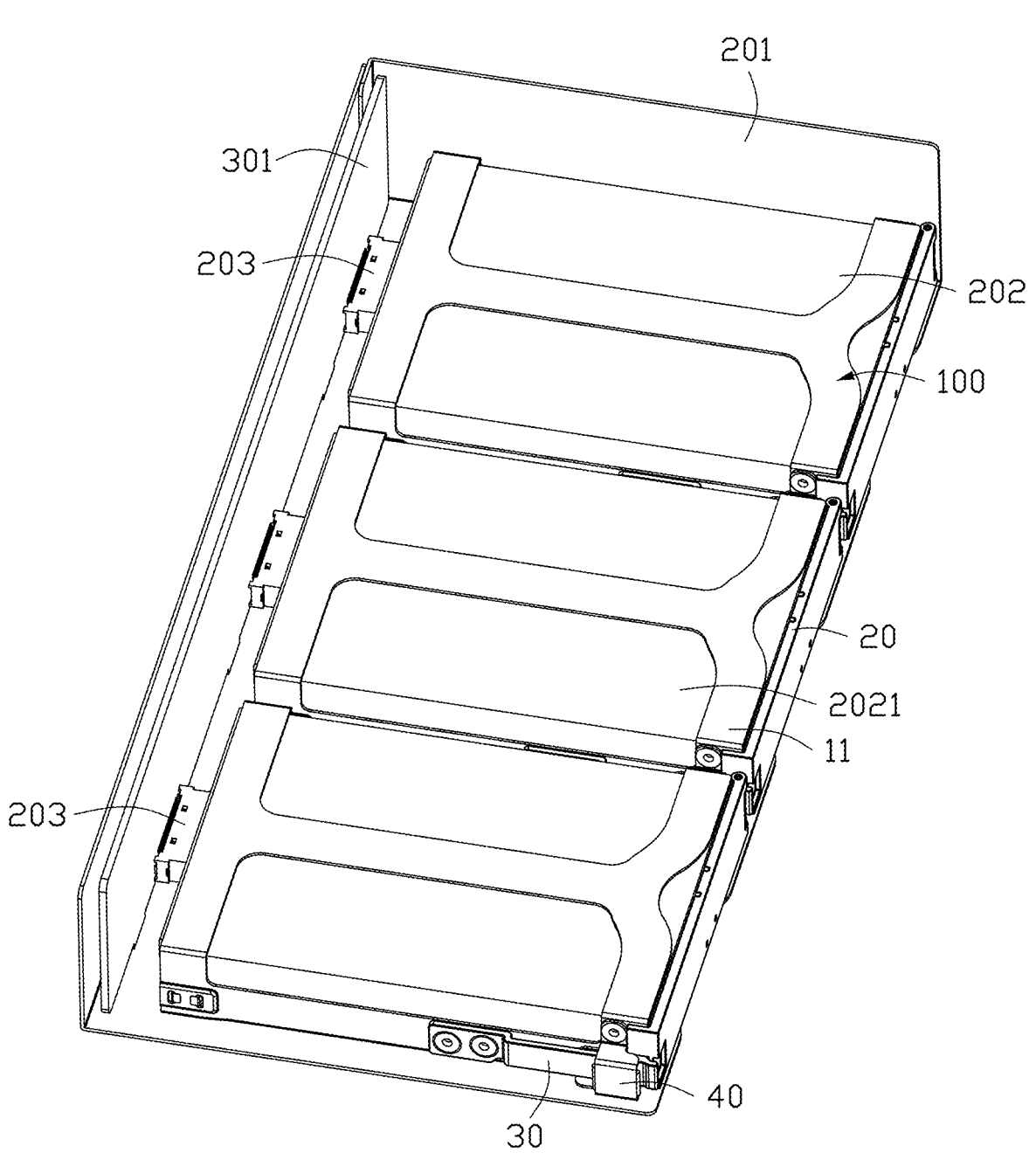
FIG. 1 is an isometric view of an embodiment of a computing device according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1, a computing device 300 includes a motherboard 301, at least one data storage device 202, and a cabinet 200. The cabinet is used for accommodating and protecting the motherboard 301 and the data storage device 202. For example, the computing device 300 is a server, and the data storage device 202 is a solid state drive (SSD).

The cabinet 200 includes a chassis 201, a connector 203 and a mounting structure 110. The motherboard 301 is located on the chassis 201. The connector 203 is placed in the cabinet 200 and is electrically connected on the motherboard 301. The mounting structure 110 is located on the chassis 201. The data storage device 202 can be installed in the mounting structure 110.

As shown in FIG. 1, When the data storage device 202 is installed in the mounting structure 110, the connector 203 is connected to the data storage device 202, to connect the motherboard 301 and the data storage device 202.

Figure 2:
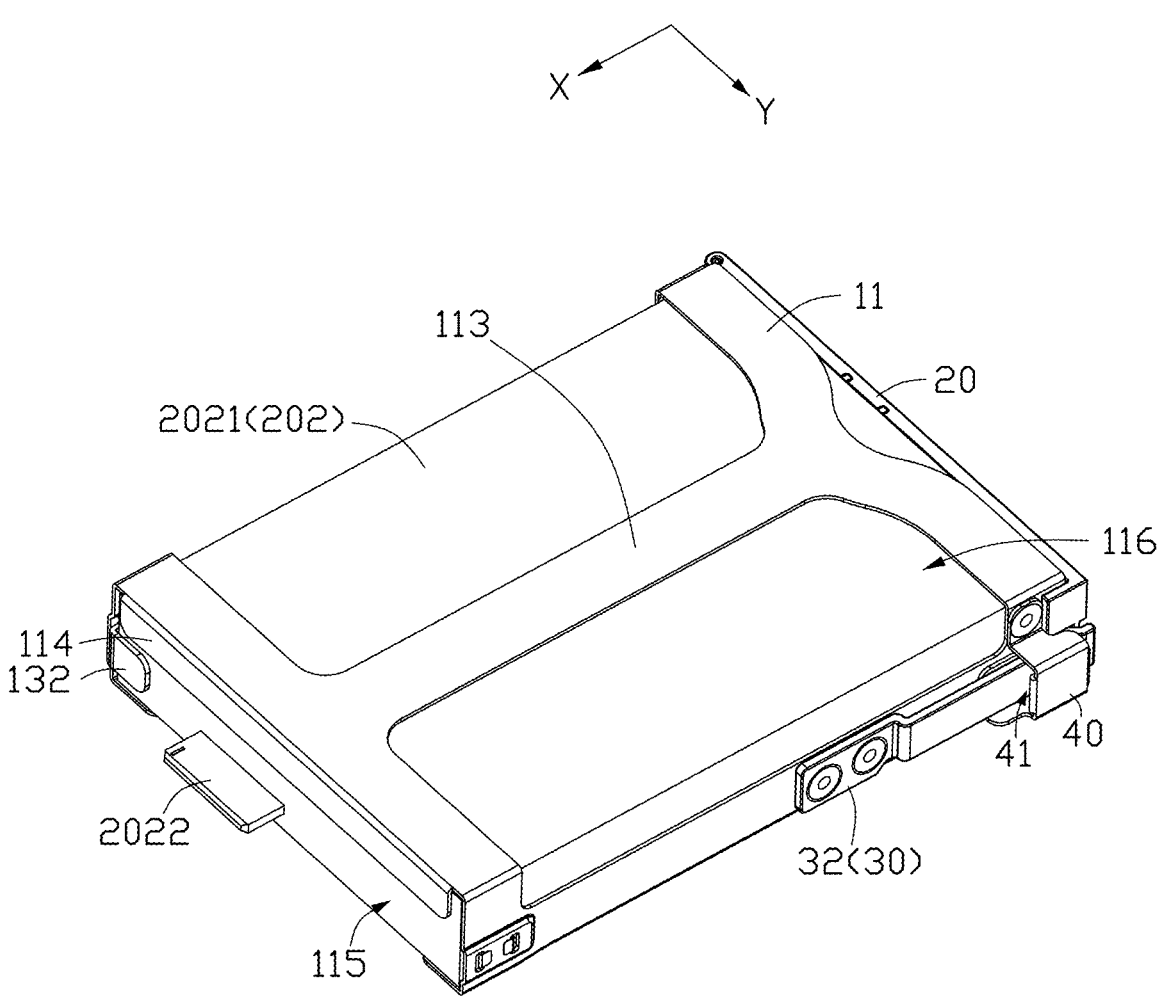
FIG. 2 is an isometric view of a mounting structure shown in FIG. 1, showing the mounting structure accommodating a data storage device.

As shown in FIG. 2, the data storage device 202 includes a main body 2021 and a port 2022. The main body 2021 is connected to the port 2022. When the main body 2021 is installed in the mounting structure 110, the port 2022 is electrically connected to the connector 203, so the data storage device 202 is electrically connected to the motherboard 301.

In some embodiments, there are a plurality of data storage devices 202 and mounting structures 110, each data storage device 202 is installed in each mounting structure 110.

Figure 3:
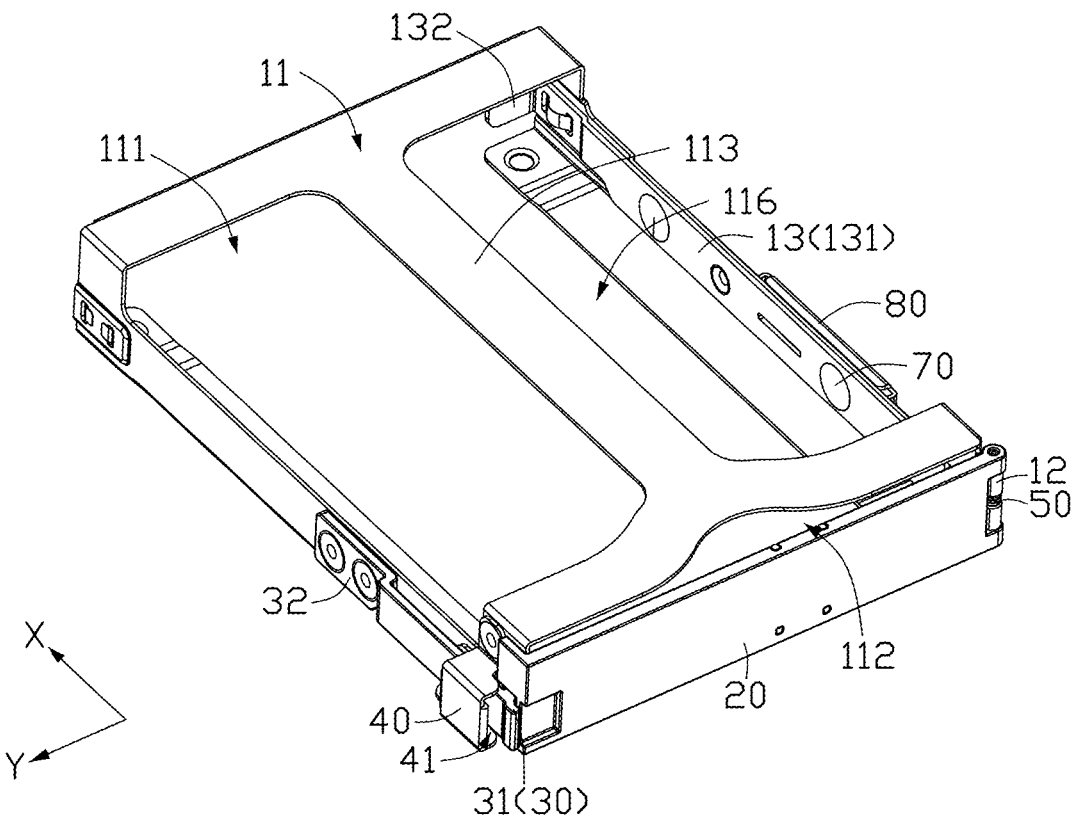
FIG. 3 is an isometric view of the mounting structure shown in FIG. 2, showing the mounting structure without the data storage device.

As shown in FIG. 3, In some embodiments, the mounting structure 110 includes a cage 11, a door 20, a lock 30, and a sliding piece 13. The cage 11 has a cavity 111 and an opening 112 connected to the cavity 111. The cavity 111 is used for accommodating the data storage device 202. The sliding piece 13 is slidably located on the cage 11 and in the cavity 111. The sliding piece 13 is slidable relative to the cage 11 in a direction X between a first position and a second position. The door 20 is rotatably connected to the sliding piece 13 and is used for covering or uncovering the opening 112. The lock 30 is located on the cage 11 and is used for locking the door 20 to cover the opening 112. The sliding piece 13 is used for pushing the data storage device 202 outwards from the cavity 111.

When taking the data storage device 202 out from the cavity 111, users unlock the lock 30 and rotate the door 20 to uncover the opening 112, so the data storage device 202 can be taken out from the opening 112, then pull the door 20 outwards from the cavity 111, so the door 20 pulls the sliding piece 13 outwards from the cavity 111 until the sliding piece 13 is located on the second position, and in the same time the sliding piece 13 pushes the data storage device 202 outwards from the cavity 111 and the data storage device 202 partially located outside the cavity 111, for easily taking the data storage device 202 out from the cavity 111. When installing the data storage device 202 into the cavity 111, users insert the data storage device 202 in the direction X into the cavity 111 from the opening 112, until the data storage device 202 pushes the sliding piece 13 to the first position, so the data storage device 202 is fully accommodated in the cavity 111, then rotate the door 20 until the lock 30 locks the door 20, so the data storage device 202 is installed in the cavity 111. Thus, it is toolless to install or uninstall the data storage device 202 and the mounting structure 110, saving time and getting more convenient.

Figure 4:
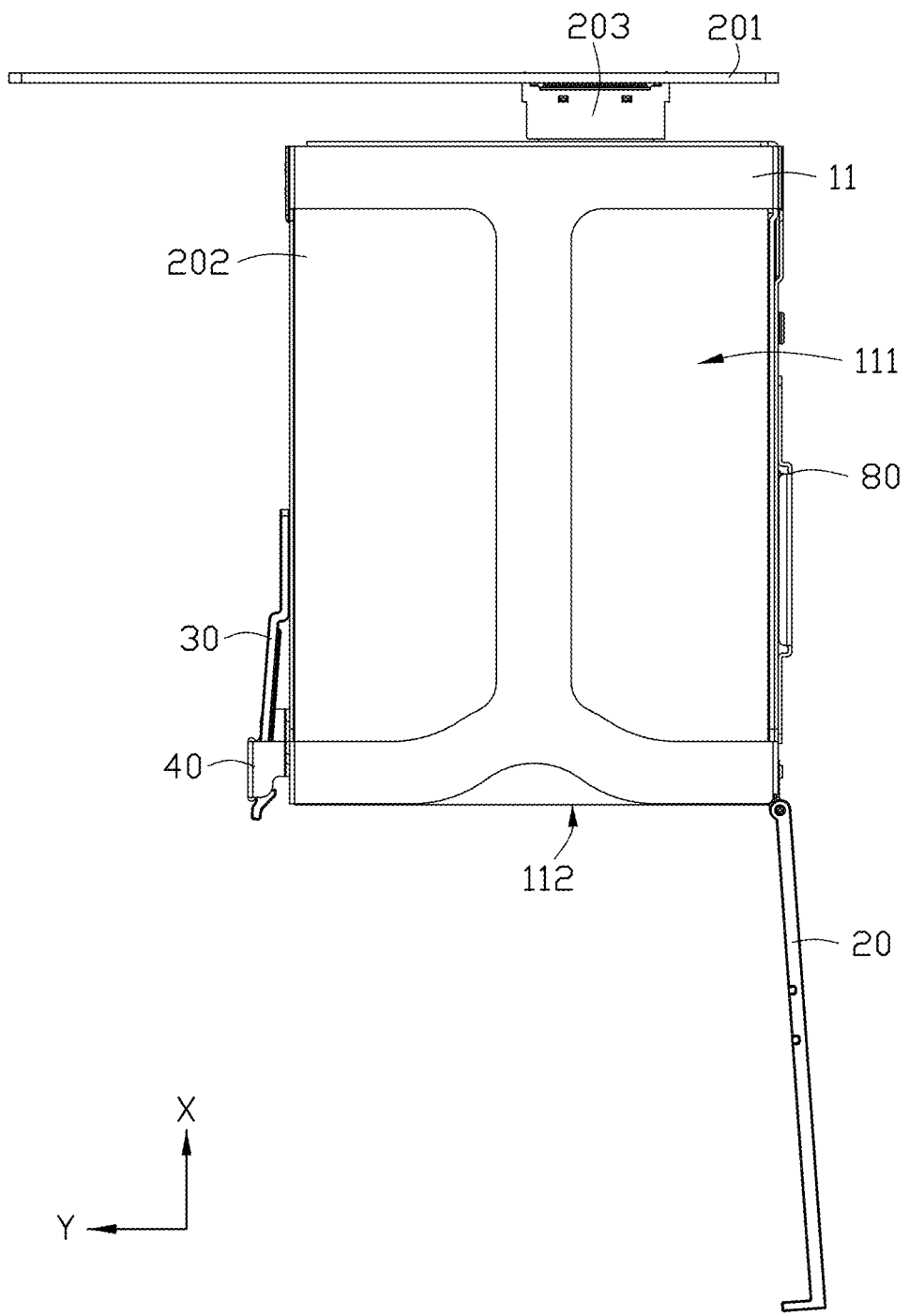
FIG. 4 is a top view of the mounting structure shown in FIG. 1, showing a door uncover an opening.
Figure 5:
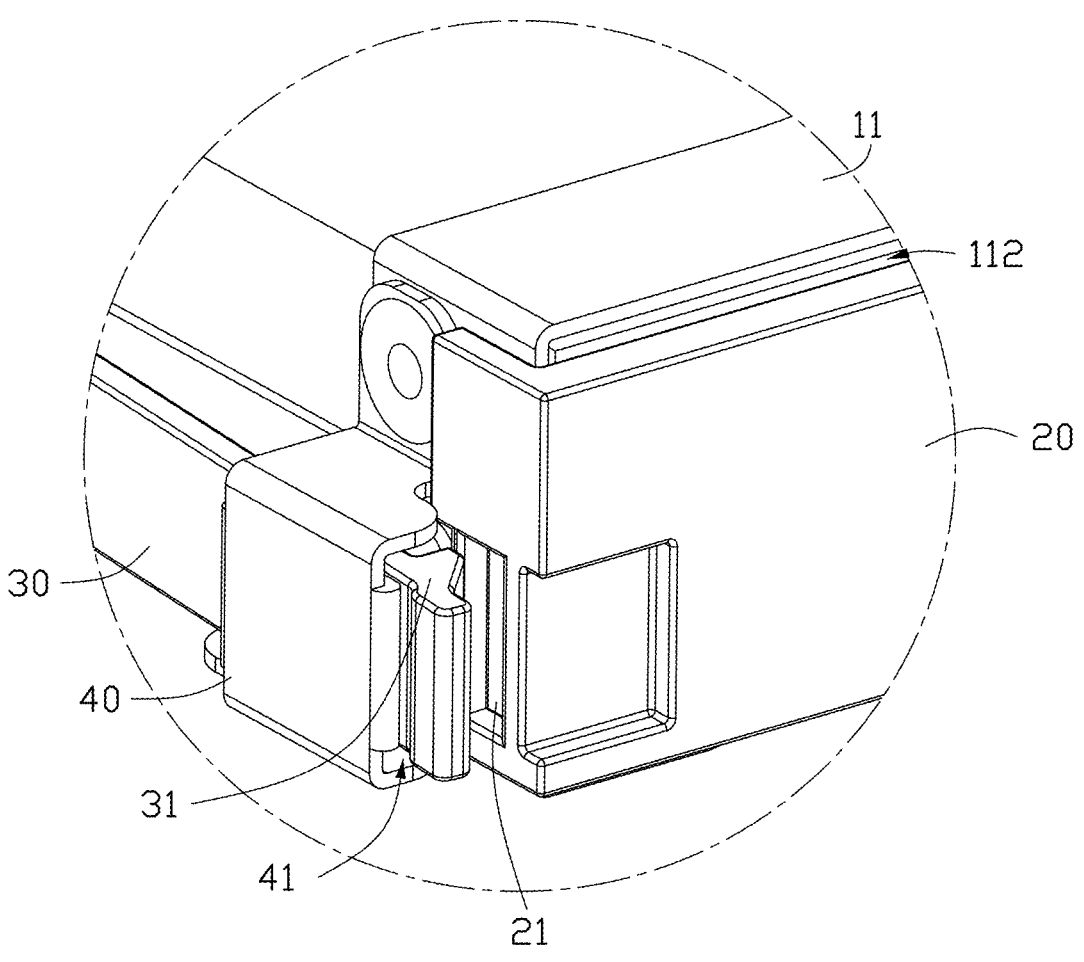
FIG. 5 is an enlarged view of a door locked by a lock shown in FIG. 3.

As shown in FIG. 3 to FIG. 5, in some embodiments, the door 20 has a first cooperating part 21, and the lock 30 has a second cooperating part 31. The second cooperating part 31 cooperates with the first cooperating part 21 to lock the door 20. The second cooperating part 31 deforms away from the first cooperating part 21 to unlock the door 20.

When uncovering the opening 112, pull the first cooperating part 21 away from the second cooperating part 31 in a direction Y, to release the first cooperating part 21 from the second cooperating part 31, allowing the door 20 to rotate to uncover the opening 112.

As shown in FIG. 5, in some embodiments, the first cooperating part 21 defines a hole, and the second cooperating part 31 defines a protrusion. The protrusion is insertable into the hole, to lock the door 20. Or in some other embodiments, the first cooperating part 21 defines a protrusion, and the second cooperating part 31 defines a hole.

In some embodiments, the first cooperating part 21 defines a groove, the second cooperating part 31 defines a protrusion. The protrusion is insertable into the groove, to lock the door 20. Or in some other embodiments, the first cooperating part 21 defines a protrusion, and the second cooperating part 31 defines a groove.

As shown in FIG. 3, in some embodiments, the lock 30 includes an installing part 32. The installing part 32 is connected to the second cooperating part 31. The installing part 32 is located on the outer surface of the cage 11. The lock 30 is elastic, so the second cooperating part 31 can deform away from the first cooperating part 21 under the action of an external force to unlock the door 20, and the second cooperating part 31 can recover elastic deformation to lock the door 20.

As shown in FIG. 3 to FIG. 5, in some embodiments, the mounting structure 110 further includes a limiting piece 40. The limiting piece 40 is located on the cage 11. The limiting piece 40 has a limiting hole 41. The second cooperating part 31 extends through the limiting hole 41 and deforms in the limiting hole 41. The limiting piece 40 is used for limiting the deformation of the second cooperating part 31 away from the first cooperating part 21.

Because the limiting piece 40 limits the deformation of the second cooperating part 31 away from the first cooperating part 21, preventing the second cooperating part 31 from being excessively deformed, so the second cooperating part 31 will not be broken due to excessive deformation.

Figure 6:
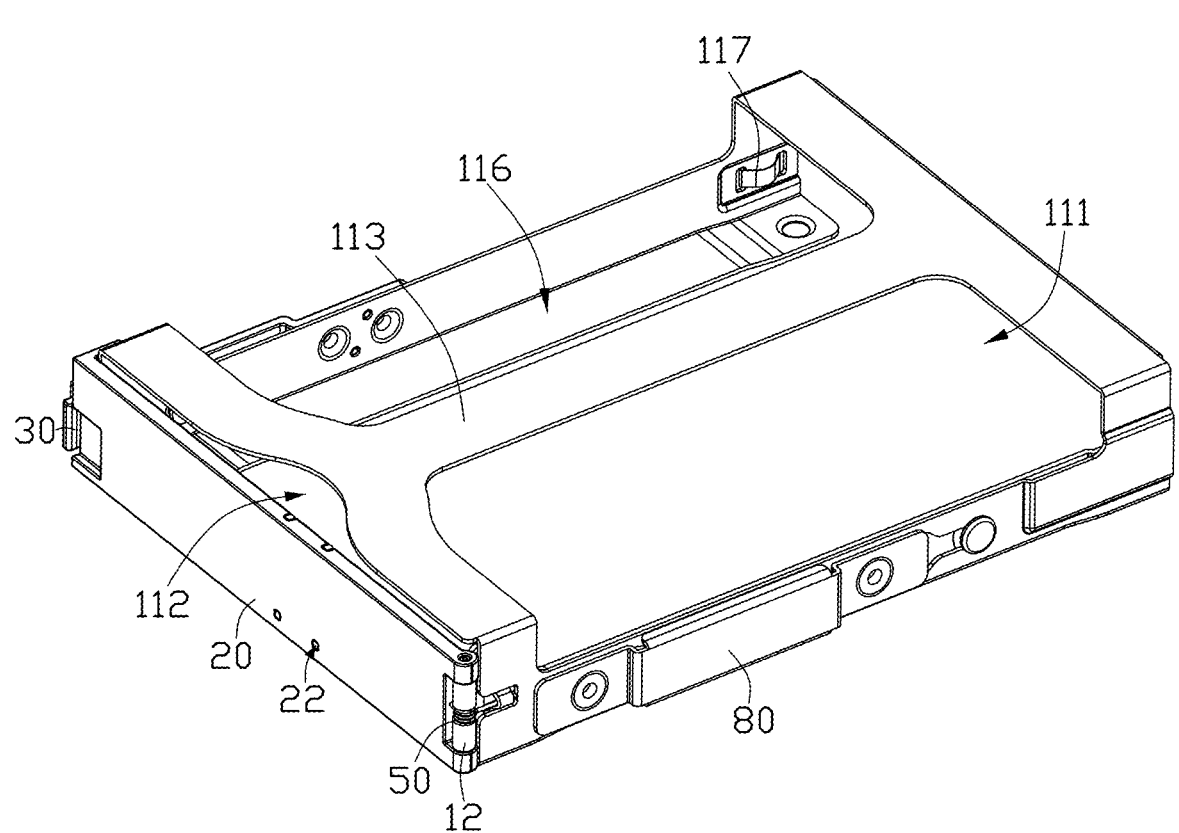
FIG. 6 is an isometric view of the mounting structure shown in FIG. 2, showing the mounting structure without the data storage device.

As shown in FIG. 6, in some embodiments, the mounting structure 110 further includes a first spring 50. The first spring 50 is connected to the door 20 and the sliding piece 13, and the first spring 50 is used for rotating the door 20 to uncover the opening 112.

When unlocking the lock 30 to the door 20, the door 20 will automatically uncover the opening 112 because of the first spring 50, improving the convenience of taking the data storage device 202 out.

As shown in FIG. 6, in some embodiments, the first spring 50 is a torsion spring. The door 20 and the sliding piece 13 is connected by a shaft 12. The torsion spring is wrapped around the shaft 12, and the two ends of the torsion spring apply forces to the door 20 and the cage 11, to drive the door 20 to uncover the opening 112 after unlocking the lock 30.

As shown in FIG. 1 to FIG. 2, in some embodiments, the cage 11 has an avoiding opening 115 on the opposite side to the opening 112. When the data storage device 202 enters the cavity 111 through the opening 112, the port 2022 extends out of the cavity 111 through the avoiding opening 115 to connect the connector 203.

As shown in FIG. 2, in some embodiments, the cage 11 includes a frame 113 and a stopping sheet 114. The avoiding opening 115 is defined between the stopping sheet 114 and the frame 113. The opening 112 is defined on the frame 113. The opening 112 and the avoiding opening 115 are located on opposite sides of the frame 113. The stopping sheet 114 stops the main body 2021 from moving out of the cavity 111 through the avoiding opening 115. The stopping sheet 114 is connected to the top of the frame 113, so the avoiding opening 115 is below the stopping sheet 114.

When the main body 2021 is inserted into the cavity 111 correctly, the stopping sheet 114 stops the main body 2021 and the port 2022 extends out of the cavity 111 through the avoiding opening 115. But when the main body 2021 is inserted into the cavity 111 upside down, the port 2022 will be stopped by the stopping sheet 114, so the port 2022 cannot extend out of the cavity 111 through the avoiding opening 115 and the main body 2021 cannot be fully accommodated in the cavity 111, which facilitates blind installation of the data storage device 202.

As shown in FIG. 2 to FIG. 3, in some embodiments, the cage 11 has at least one heat dissipation vent 116. The heat dissipation vent 116 is connected to the cavity 111. When the data storage device 202 is working, the heat generated can be transferred from the heat dissipation vent 116 to the outside of the cage 11, thereby reducing the accumulation of heat in the cavity 111, making the data storage device 202 less likely to be damaged, and increasing the service life of the data storage device 202.

As shown in FIG. 6, in some embodiments, the cage 11 has at least one grounding spring sheet metal 117 for preventing electromagnetic interference. When the data storage device 202 is installed in the cavity 111, the data storage device 202 is in contact with the grounding spring sheet metal 117, so that the data storage device 202 is grounded, to prevent electromagnetic interference.

As shown in FIG. 3 to FIG. 7, in some embodiments, the sliding piece 13 includes a sliding part 131 and a pushing part 132, and the pushing part 132 is perpendicular to the sliding part 131. The sliding part 131 is slidably located on the cage 11, so the sliding piece 13 can slide relative to the cage 11 in the direction X by the sliding part 131. When installing the data storage device 202, the data storage device 202 pushes the pushing part 132 to move the sliding piece 13, until the sliding piece 13 moves to the first position. When taking the data storage device 202 out, the pushing part 132 pushes the data storage device 202 outwards from the cavity 111.

Figure 7:
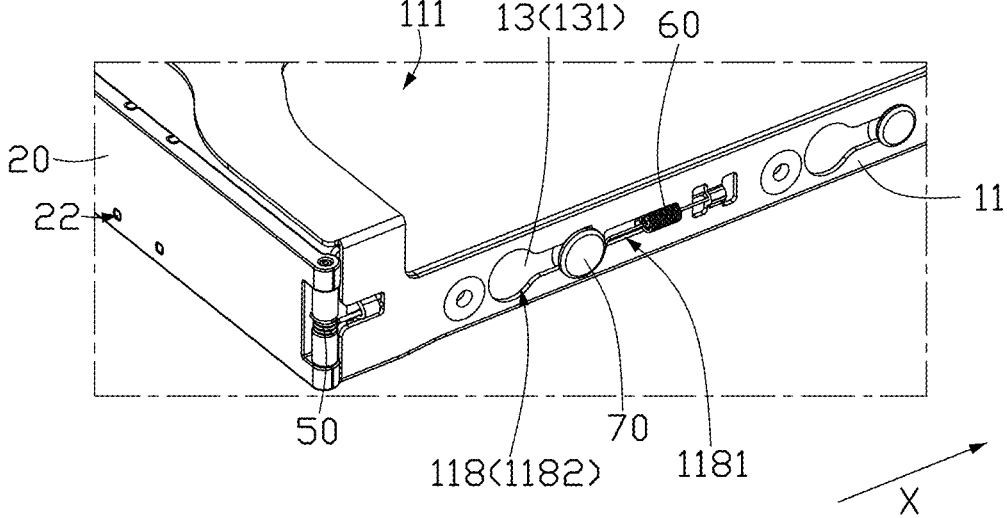
FIG. 7 is an isometric view of an inner structure of the mounting structure shown in FIG. 6.

As shown in FIG. 7, in some embodiments, the mounting structure 110 further includes a second spring 60. The second spring 60 connects the sliding piece 13 and the cage

5

11. The second spring 60 is used for pulling the sliding piece 13 back to the first position from the second position. it helps users to buckle the lock 30 without returning the door 20 to its original position (the first position) and prevents the door 20 from accidentally slipping out during transportation. For example, the second spring 60 is a tension spring.

As shown in FIG. 7, in some embodiments, the mounting structure 110 further includes a pin 70. The cage 11 has a sliding slot 118, and the pin 70 is slidably placed in the sliding slot 118. The second spring 60 connects the cage 11 and the pin 70. The sliding slot 118 extends in the direction X. The sliding slot 118 is used for guiding the pin 70, to guide the sliding piece 13 slide in the direction X relative to the cage 11.

As shown in FIG. 7, in some embodiments, the sliding slot 118 defines a guiding section 1181 and an assembling hole 1182. The pin 70 is in the shape of a nail. The diameter of the assembling hole 1182 is greater than the diameter of the head of the pin 70, and the width of the guiding section 1181 is equal to the diameter of the column of the pin 70. The guiding section 1181 is used for guiding the movement of the pin 70 in the direction X. The head of the pin 70 can pass through the assembling hole 1182 so the column of the pin 70 can be installed in the guiding section 1181.

Figure 8:
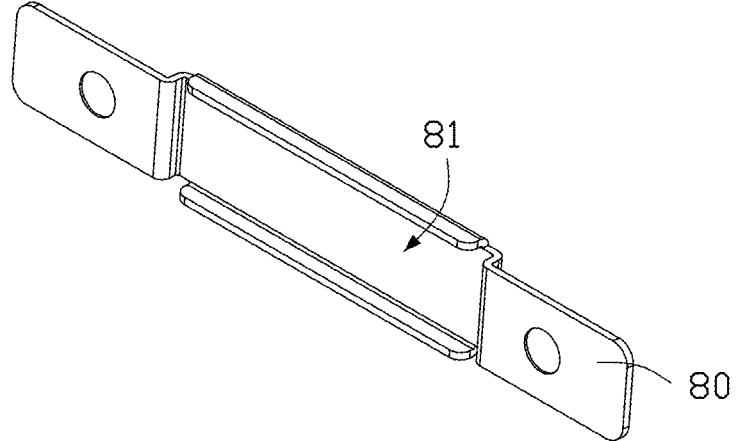
FIG. 8 is an isometric view of a covering piece shown in FIG. 6.

As shown in FIG. 6 to FIG. 8, in some embodiments, the mounting structure 110 further includes a covering piece 80. The covering piece 80 is located on the cage 11. A sliding space 81 is defined between the covering piece 80 and the cage 11. The head of the pin 70 is placed in the sliding space 81, and the second spring 60 is placed in the sliding space 81. The covering piece 80 covers the assembling hole 1182, so the head of the pin 70 will not slide into the assembling hole 1182, to keep the column of the pin 70 stay in the guiding section 1181.

Figure 10:
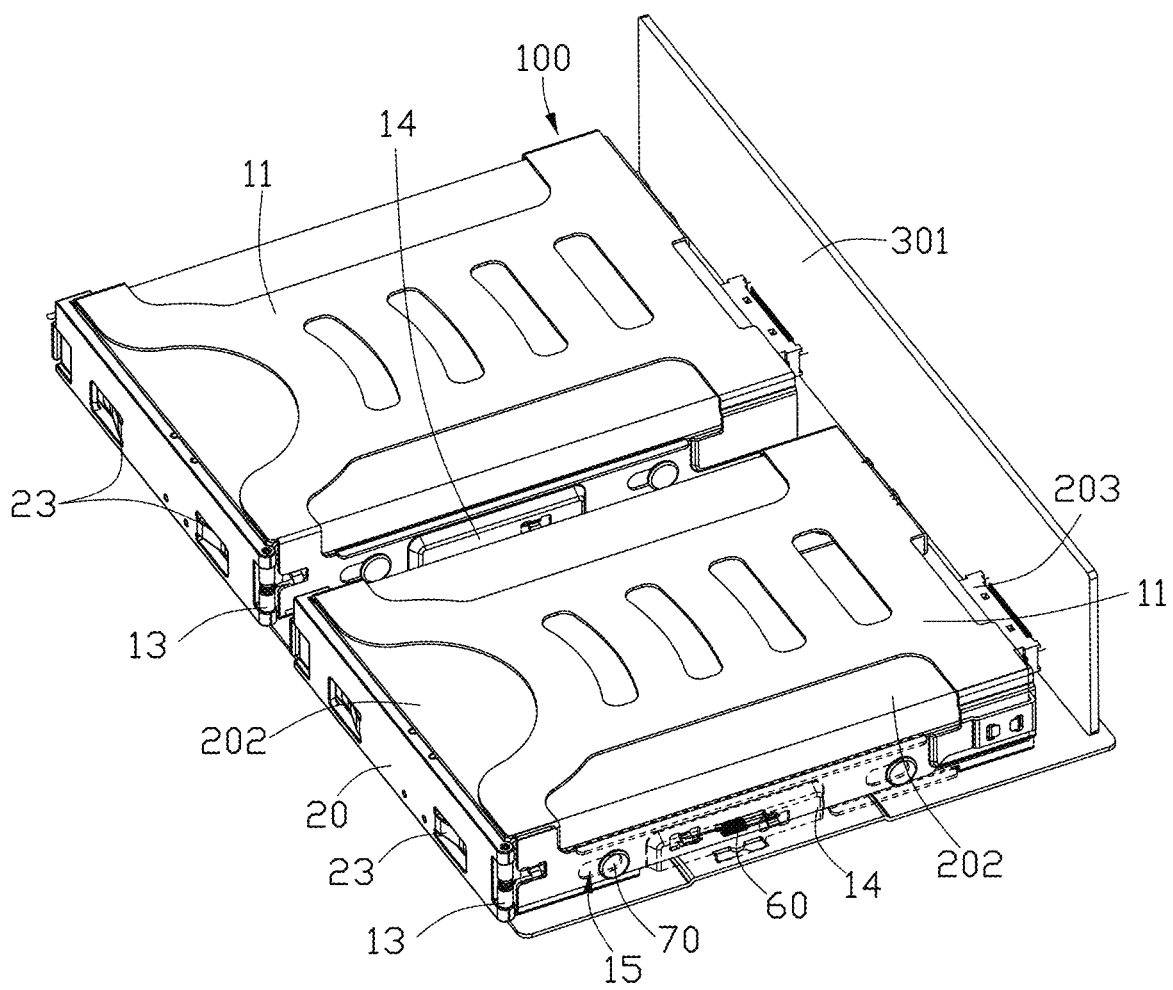
FIG. 10 is an isometric view of another embodiment of a computing device according to the present disclosure.

As shown in FIG. 10, in some other embodiments, the covering piece 80 and the sliding slot 118 are removed. As an alternative, the cage 11 has a bulge 14. A chamber is formed between the bulge 14 and the sliding piece 13. The second spring 60 is placed in the chamber, and the second spring 60 connects the sliding piece 13 and the bulge 14. The pin 70 is placed outside the chamber. The cage 11 has a sliding groove 15, and the pin 70 is slidably placed in the sliding groove 15. The sliding groove 15 is used for guiding the pin 70 to move in the direction X. The length of sliding groove 15 is the maximum sliding distance of the pin 70 and the sliding piece 13.

Figure 9:
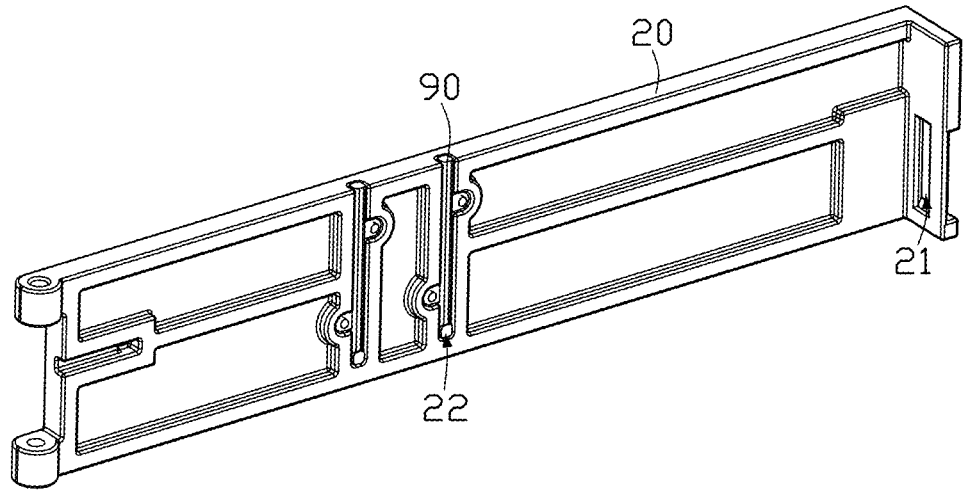
FIG. 9 is an isometric view of a door shown in FIG. 6, showing an inner surface of the door with two light conducting pipes.

As shown in FIG. 7 to FIG. 9, in some embodiments, the data storage device 202 has a light located close to the door 20. When the data storage device 202 is connected to the connector 203, the light of the data storage device 202 is light on. The mounting structure 110 further includes a light conducting pipe 90. The light conducting pipe 90 is located on the inner surface of the door 20. The door 20 has at least one light hole 22. When the light of the data storage device 202 is light on, the light conducting pipe 90 conducts the light to the light hole 22, so users can see the light from the light hole 22 to judge the working condition of the data storage device 202, such as by observing whether the light is on, it can be determined whether the data storage device 202 is connected to the connector 203 in place. The light holes 22 are located on the front surface of the door 20 and on the top surface of the door 20, easy to observe from multiple angles for users.

As shown in FIG. 10, in some embodiments, the door 20 has a spring leaf 23. The spring leaf 23 is used for pushing the data storage device 202 to the connector 203 when the door 20 is locked, to improve the stability of the connection between the data storage device 202 and the connector 203.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A mounting structure for mounting a data storage device comprising:
    a cage defining an opening and a cavity, the cavity accommodating the data storage device and the data storage device entering and exiting the cavity through the opening;
    a sliding piece located on the cage and slidable relative to the cage, the sliding piece comprising a pushing part for pushing the data storage device outwards from the cavity;
    a door rotatably located on the sliding piece and configured for covering or uncovering the opening; and
    a lock located on the cage and configured for locking the door to cover the opening,
    wherein in a case that the data storage device is accommodated in the cavity, the door is locked by the lock and the sliding piece is located on a first position; in a case that the lock unlocks the door and the sliding piece slides, the pushing part pushes the data storage device outwards from the cavity through the opening;
    wherein the door comprises a first cooperating part, the lock comprises a second cooperating part, the second cooperating part cooperates with the first cooperating part to lock the door, the second cooperating part deforms away from the first cooperating part to unlock the door, the first cooperating part defines a hole, and the second cooperating part defines a protrusion, the protrusion is insertable into the hole to lock the door;
    wherein the lock comprises an installing part, the installing part is connected to the second cooperating part, the installing part is located on the outer surface of the cage, the lock is elastic, the second cooperating part deforms away from the first cooperating part under an external force to unlock the door, and the second cooperating part recovers from elastic deformation to lock the door;
    wherein the cage comprises a bulge, and a chamber between the bulge and the sliding piece; the mounting structure further comprises a pin and a second spring, the second spring is connected to the sliding piece and the cage, the second spring moves the sliding piece, the second spring is placed in the chamber and connects the sliding piece and the bulge, the pin is placed outside the chamber, the cage further comprise a sliding groove, and the pin is slidably placed in the sliding groove, the sliding groove is configured for guiding the pin, a length of sliding groove is a maximum sliding distance of the pin and the sliding piece.

2. The mounting structure of claim 1 further comprises a limiting piece, the limiting piece is located on the cage, the limiting piece defines a limiting hole, the second cooperating part extends through the limiting hole and deformable in the limiting hole, the limiting piece limits the deformation of the second cooperating part away from the first cooperating part.

3. The mounting structure of claim 1, wherein the mounting structure further comprises a first spring, the first spring is located between the sliding piece and the door, the first spring rotates the door to uncover the opening.

4. The mounting structure of claim 1 further comprises a light conducting pipe, the light conducting pipe is located on the door, the door defines a light hole, the light conducting pipe is configured for conducting a light from the data storage device to the light hole.

5. A cabinet comprising:
a chassis;
a connector placed in the chassis; and
a mounting structure located on the chassis and config-
    ured for mounting a data storage device to the chassis,
    wherein the mounting structure comprising:
    a cage defining an opening and a cavity, the cavity
        accommodating the data storage device and the data
        storage device entering and exiting the cavity
        through the opening;
    a sliding piece located on the cage and slidable relative
        to the cage, the sliding piece comprising a pushing
        part for pushing the data storage device outwards
        from the cavity;
    a door rotatably located on the sliding piece and
        configured for covering or uncovering the opening;
        and
    a lock located on the cage and configured for locking
        the door to cover the opening,
    wherein in a case that the data storage device is
        accommodated in the cavity, the door is locked by
        the lock and the sliding piece is located on a first
        position, to connect the data storage device to the
        connector; in a case that the lock unlocks the door
        and the sliding piece slides, the pushing part pushes
        the data storage device outwards from the cavity
        through the opening, to disconnect the data storage
        device from the connector;
    wherein the door comprises a first cooperating part, the
        lock comprises a second cooperating part, the second
        cooperating part cooperates with the first cooperat-
        ing part to lock the door, the second cooperating part
        deforms away from the first cooperating part to
        unlock the door, the first cooperating part defines a
        hole, and the second cooperating part defines a
        protrusion, the protrusion is insertable into the hole
        to lock the door;
    wherein the lock comprises an installing part, the
        installing part is connected to the second cooperating
        part, the installing part is located on the outer surface
        of the cage, the lock is elastic, the second cooperat-
        ing part deforms away from the first cooperating part
        under an external force to unlock the door, and the
        second cooperating part recovers from elastic defor-
        mation to lock the door;
    wherein the cage comprise a bulge, and a chamber
        between the bulge and the sliding piece; the mount-
        ing structure further comprises a pin and a second
        spring, the second spring is connected to the sliding
        piece and the cage, the second spring moves the
        sliding piece, the second spring is placed in the
        chamber and connects the sliding piece and the
        bulge, the pin is placed outside the chamber, the cage
        further comprises a sliding groove, and the pin is
        slidably placed in the sliding groove, the sliding groove is configured for guiding the pin, a length of sliding groove is a maximum sliding distance of the pin and the sliding piece.

6. The cabinet of claim 5, wherein the mounting structure further comprises a limiting piece, the limiting piece is located on the cage, the limiting piece defines a limiting hole, the second cooperating part extends through the limiting hole and deformable in the limiting hole, the limiting piece limits the deformation of the second cooperating part away from the first cooperating part.

7. The cabinet of claim 5, wherein the mounting structure further comprises a first spring, the first spring is located between the sliding piece and the door, the first spring rotates the door to uncover the opening.

8. The cabinet of claim 5, wherein the mounting structure further comprises a light conducting pipe, the light conduct-ing pipe is located on the door, the door defines a light hole, the light conducting pipe is configured for conducting a light from the data storage device to the light hole.

9. A computing device comprises:
a motherboard;
a data storage device; and
a cabinet accommodating the motherboard and the data
    storage device, wherein the cabinet comprises:
    a chassis configured for positioning the motherboard;
    a connector placed in the chassis and connected to the
        motherboard; and
    a mounting structure located on the chassis and con-
        figured for mounting a data storage device to the
        chassis, wherein the mounting structure comprises:
        a cage defining an opening and a cavity, the cavity
            accommodating the data storage device and the
            data storage device entering and exiting the cavity
            through the opening;
        a sliding piece located on the cage and slidable
            relative to the cage, the sliding piece comprising a
            pushing part for pushing the data storage device
            outwards from the cavity;
        a door rotatably located on the sliding piece and
            configured for covering or uncovering the open-
            ing; and
        a lock located on the cage and configured for locking
            the door to cover the opening,
        wherein in a case that the data storage device is
            accommodated in the cavity, the door is locked by
            the lock and the sliding piece is located on a first
            position, to connect the data storage device to the
            connector; in a case that the lock unlocks the door
            and the sliding piece slides, the pushing part
            pushes the data storage device outwards from the
            cavity through the opening, to disconnect the data
            storage device from the connector;
        wherein the door comprises a first cooperating part,
            the lock comprises a second cooperating part, the
            second cooperating part cooperates with the first
            cooperating part to lock the door, the second
            cooperating part deforms away from the first
            cooperating part to unlock the door, the first
            cooperating part defines a hole, and the second
            cooperating part defines a protrusion, the protru-
            sion is insertable into the hole to lock the door;
        wherein the lock comprises an installing part, the
            installing part is connected to the second cooper-
            ating part, the installing part is located on the outer
            surface of the cage, the lock is elastic, the second
            cooperating part deforms away from the first
            cooperating part under an external force to unlock the door, and the second cooperating part recovers from elastic deformation to lock the door;

wherein the cage comprises a bulge, and a chamber between the bulge and the sliding piece, the mounting structure further comprises a pin and a second spring, the second spring is connected to the sliding piece and the cage, the second spring moves the sliding piece, the second spring is placed in the chamber and connects the sliding piece and the bulge, the pin is placed outside the chamber, the cage further comprises a sliding groove, and the pin is slidably placed in the sliding groove, the sliding groove is configured for guiding the pin, a length of sliding groove is a maximum sliding distance of the pin and the sliding piece.

10. The computing device of claim 9, wherein the mounting structure further comprises a limiting piece, the limiting piece is located on the cage, the limiting piece defines a limiting hole, the second cooperating part extends through the limiting hole and deformable in the limiting hole, the limiting piece limits the deformation of the second cooperating part away from the first cooperating part.

11. The computing device of claim 9, wherein the mounting structure further comprises a first spring, the first spring is located between the sliding piece and the door, the first spring rotates the door to uncover the opening.

* * * * *